(12) United States Patent
Kerr et al.

(10) Patent No.: US 6,620,280 B2
(45) Date of Patent: Sep. 16, 2003

(54) DUAL SIDED LAMINATION

(75) Inventors: Roger S. Kerr, Brockport, NY (US); Seung Ho Baek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 69 days.

(21) Appl. No.: 10/041,837

(22) Filed: Oct. 19, 2001

(65) Prior Publication Data

US 2003/0075265 A1 Apr. 24, 2003

(51) Int. Cl.$^7$ .............................................. B32B 31/00
(52) U.S. Cl. ...................... 156/230; 156/182; 156/235; 156/247; 156/277; 156/289; 430/293
(58) Field of Search ................................. 156/155, 182, 156/230, 235, 240, 247, 249, 277, 289, 308.2, 323, 324.4, 253; 428/41.8, 42.3, 46; 427/146, 147, 148, 208, 208.8; 347/101, 103, 105; 430/293

(56) References Cited

U.S. PATENT DOCUMENTS

| 4,619,728 A | * 10/1986 | Brink .......................... 156/555 |
| 5,203,942 A | 4/1993 | DeCook et al. |
| 5,268,708 A | 12/1993 | Harshbarger et al. |
| 5,478,434 A | 12/1995 | Kerr et al. |
| 5,487,801 A | * 1/1996 | Marion et al. ................. 156/64 |

OTHER PUBLICATIONS

Kerr, "Laminator Assembly Having a Pressure Roller with a Deformable layer", USSN 09/676,877, (Attorney Docket No. 78274), filed Sep. 29, 2000.

* cited by examiner

*Primary Examiner*—Richard Crispino
*Assistant Examiner*—Sing Po Chan
(74) *Attorney, Agent, or Firm*—Buskop Law Group, P.C.

(57) ABSTRACT

A method for laminating a dual sided pre-press proof (140) comprises laminating a first side of a receiver stock (150) with a first pre-laminate sheet (210) and laminating a second side of the receiver stock (155) with a second pre-laminate sheet (215). The first pre-laminate sheet support layer (160) and the second pre-laminate sheet support layer (162) are removed forming a pre-laminated receiver stock. A first imaged clear receiver sheet (250) and a second imaged clear receiver sheet (260) are laminated to the pre-laminated receiver stock (145) such that the registration marks on the first and second imaged clear receiver sheets are visibly positioned on top of each other and are in registration with each other. The first clear support layer (164) and the second clear support layer (166) is removed forming a dual sided pre-press proof (140), wherein the images are in registration with each other.

16 Claims, 4 Drawing Sheets

DUAL SIDED LAMINATION

FIELD OF THE INVENTION

The present invention relates to the art of color proofing, and in particular, to a method of preparing a two sided pre-press proofs such as by the use of pressure and heat to laminate media together.

BACKGROUND OF THE INVENTION

Pre-press proofing is a procedure that is used primarily by the printing industry for creating representative images of printed material. In the printing industry pre-press proofs are used to check for color balance, control parameters and other important image quality requirements, without the cost and time that is required to actually produce printing plates, set up a printing press, and produce an example of a representative image, which would result in higher costs and a loss of profits that would ultimately be passed on to the customer.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of print media in which colorant from a sheet of colorant donor material is transferred to the print media, by applying a sufficient amount of thermal energy to the colorant donor sheet material to form the representative image. The image processing apparatus is comprised generally of a material supply assembly and a lathe bed scanning subsystem. The scanning subsystem includes: a lathe bed scanning frame, translation drive, translation stage member, printhead, imaging drum, and media exit transports.

The operation of the image processing apparatus comprises of metering a length of the print media (in roll form) from the material supply assembly. The print media is then measured and cut into sheet form of the required length and transported to the imaging drum, registered, wrapped around, and secured onto the imaging drum. Next, a length of colorant donor material (in roll form) is also metered out of the material supply assembly, then measured and cut into sheet form of the required length. It is then transported to the imaging drum and wrapped around the imaging drum utilizing a load roller which is described in detail, in commonly assigned U.S. Pat. No. 5,268,708, such that it is superposed in the desired registration with respect to the print media (which has already been secured to the imaging drum).

After the colorant donor sheet material is secured to the periphery of the imaging drum the scanning subsystem or write engine provides the imaging function. This image function is accomplished by retaining the print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the print media.

Once the representative image has been formed on the print media, the colorant donor sheet material is then removed from the imaging drum. This is accomplished without disturbing the print media that is beneath it. The colorant donor sheet material is then transported out of the image processing apparatus by means of the material exit transport. Additional colorant donor sheet materials featuring other desired colorants are sequentially superimposed with the print media on the imaging drum and then imaged onto the print media as previously mentioned, until the representative image is completed on the print media. The representative image formed thereon is then unloaded from the imaging drum and transported by the receiver sheet material exit transport to an exit tray in the exterior of the image processing apparatus.

After a representative image has been formed on the print media as previously described it is transferred to a receiver stock such that the pre-press proof is representative of the image to be printed on a printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and pending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

Although the above described lamination method works well for most pre-press proofs and for both laser thermal and inkjet pre-press proofs. There exists a need for an improved method of laminating dual sided pre-press proofs and improving the registration of the intended images on opposite sides of the pre-press proof.

SUMMARY OF THE INVENTION

The present invention provides a method for laminating a dual sided pre-press proof that comprises laminating a first side of a receiver stock with a first pre-laminate sheet. The first pre-laminate sheet has a first pre-laminate sheet support layer and a first pre-laminate sheet release layer. Laminating a second side of the receiver stock with a second pre-laminate sheet. The second pre-laminate sheet has a second pre-laminate sheet support layer and a second pre-laminate sheet release layer. Both the first and second pre-laminate sheets could be laminated to the receiver stock at the same time. The first pre-laminate sheet support layer and the second pre-laminate sheet support layer are removed forming a pre-laminated receiver stock. A first imaged clear receiver sheet with a first clear support layer, first clear release layer, and first image registration marks are created. A second imaged clear receiver sheet with a second clear support layer, second clear release layer, and second image registration marks are created. Laminating the first and second imaged clear receiver sheets to the pre-laminated receiver stock, with the first and second imaged clear receiver sheets on opposite sides of the pre-laminated receiver stock overlapping the pre-laminated receiver stock such that the registration marks on the first and second imaged clear receiver sheets are visibly positioned on top of each other and are in registration with each other. The first clear support layer and the second clear support layer is removed forming a dual sided pre-press proof, wherein the images are in registration with each other.

The invention also relates to a method for laminating a dual sided pre-press proof that comprises creating a first and second imaged clear receiver sheet each with a clear support layer, clear release layer, and registration marks. Laminating the first and second imaged clear receiver sheets to a receiver stock, with the first and second imaged clear receiver sheets on opposite sides of the receiver stock overlapping the receiver stock such that the registration marks are visibly positioned on top of each other and in registration with each other. The clear support layers from the first and second imaged clear receiver sheets are removed forming a dual sided pre-press proof, wherein the images are in registration with each other.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
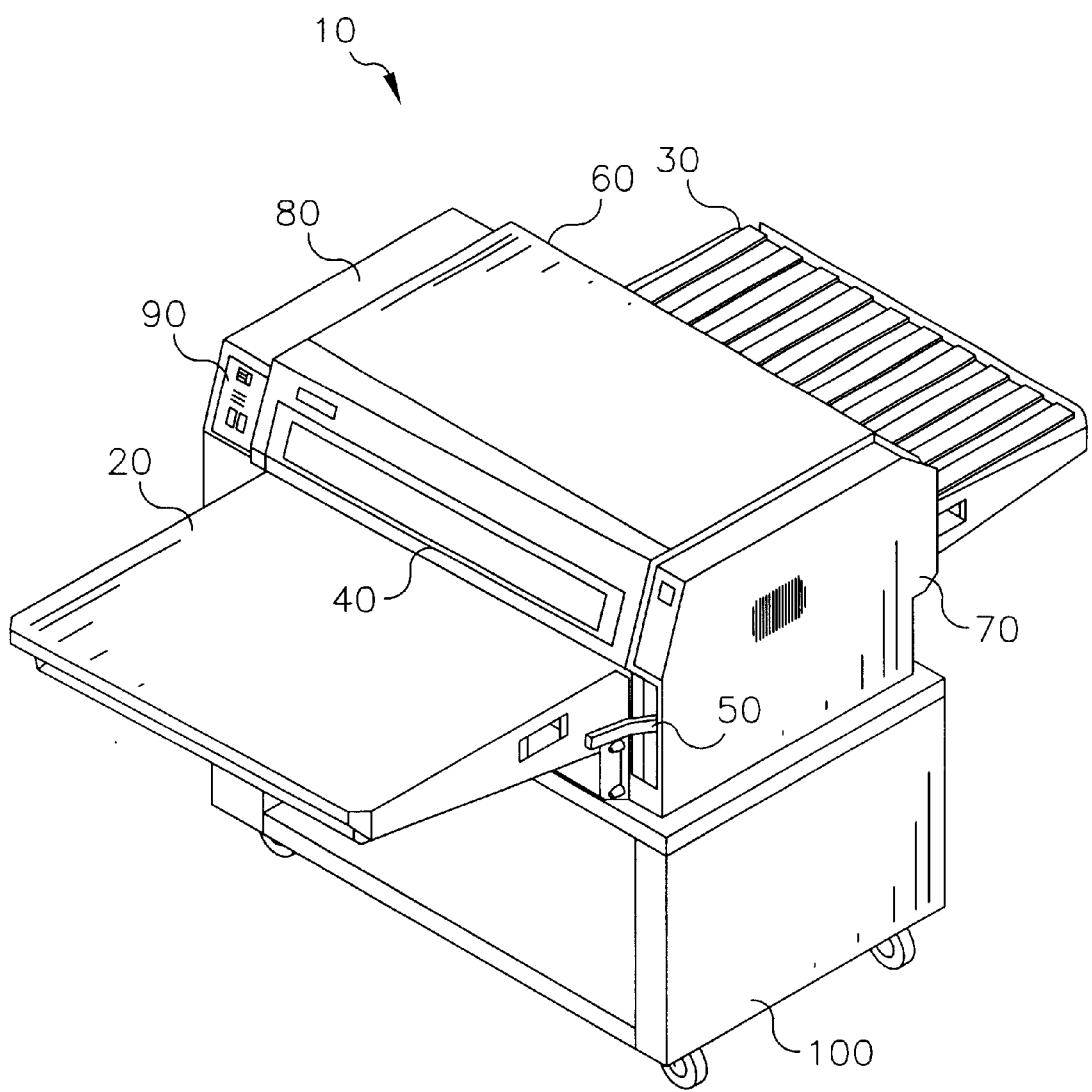
FIG. 1 is a perspective view showing a laminator known in the related are used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
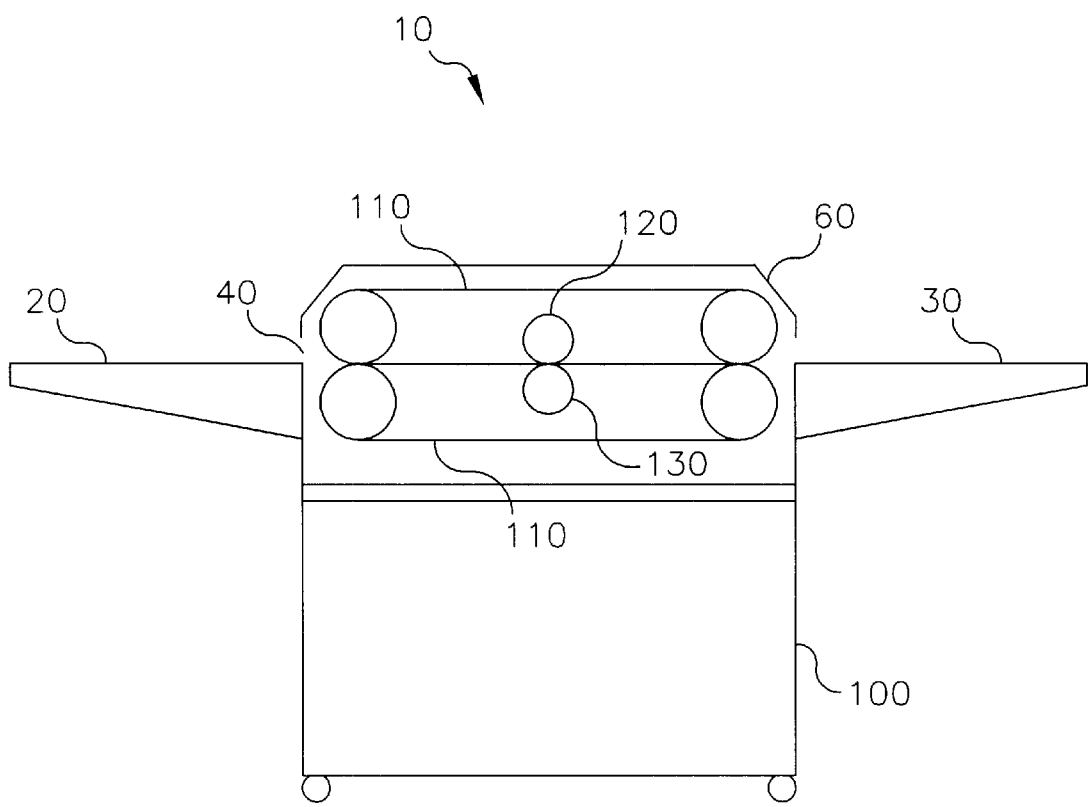
FIG. 2 is a schematic view of the laminator of FIG. 1 usable in this invention.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130 may be heated. It is further recognized that both upper lamination roller 120 and lower lamination roller 130 do not have to be heated for cold lamination applications.

The following methods are usable for forming a dual sided pre-press proof 140 with a resolution of between about 1000 and 4000 dpi, although in the most preferred embodiment, the high resolution is between 1200 and 3600 dpi with the first intended image 270 or the second intended image 275 being created on print media with an inkjet printer, laser printer, or any other printing method known in the art.

Figure 3:
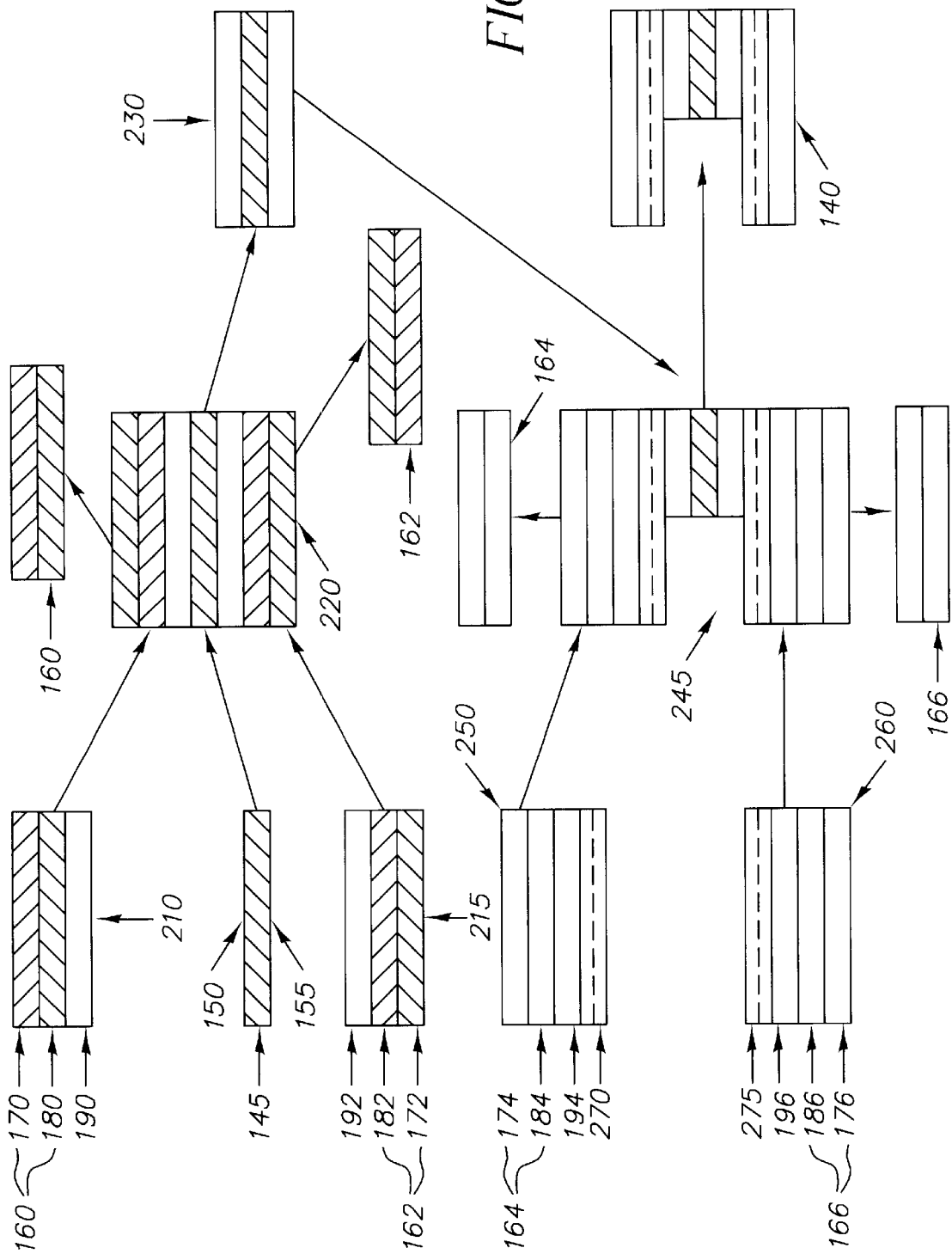
FIG. 3 is a block diagram showing one embodiment of the method for producing a pre-press proof of the invention.

Referring to FIG. 3 a block diagram is shown outlining a method for laminating a dual sided pre-press proof 140 comprising the method of laminating a first pre-laminate sheet 210 having a first thermoplastic layer 190 and a first support layer 160 with a first release layer 180 and a first support base 170 onto the first side 150 of receiver stock 145. Laminating a second pre-laminate sheet 215 having a second thermoplastic layer 192 and a second support layer 162 with a second release layer 182 and a second support base 172 onto the second side 155 of receiver stock 145 forming a pre-lamination sandwich 220. This could be done in a single lamination pass. Next, the first support layer 160 and the second support layer 162 are removed forming a dual sided pre-laminated receiver stock 230.

Simultaneously, or in series with this first series of steps, a first imaged clear receiver sheet 250 with a first intended image 270 having first image registration marks, a first thermoplastic layer 194 and first clear support layer 164 having a first clear release layer 184 and a first clear support base 174 is created. A second imaged clear receiver sheet 260 with a second intended image 275 having second image registration marks, a second thermoplastic layer 196 and second clear support layer 166 having a second clear release layer 186 and a second clear support base 176 is also formed. The first imaged clear receiver sheet 250 and second imaged clear receiver sheet 260 are then laminated to the dual sided pre-laminated receiver stock 230 such that the first imaged clear receiver sheet 250 is on a side opposite the second imaged clear receiver sheet 260, that is, each sheet is on an opposite side of the dual sided pre-laminated receiver stock 230, and the two sheets are overlapping the dual sided pre-laminated receiver stock 230 such that the first image registration marks on the first imaged clear receiver sheet 250 and the second image registration marks on the second imaged clear receiver sheet 260 are visibly positioned on top of each other and are in registration with each other forming a dual sided image lamination sandwich 245.

Next, the first clear support layer 164 and the second clear support layer 166 are removed, forming a dual sided pre-press proof 140 with a first intended image 270 on one side and a second intended image 275 on the opposite side and in registration with each other.

In alternative embodiments of this invention, only one of the first or second imaged clear receiver sheets has to be clear.

Various types of images can be used with the imaged clear receiver sheet, such as a monochrome image, or a multi-colored image. It is also within the scope of the invention to use an inkjet generated image on the imaged clear receiver sheet.

Figure 4:
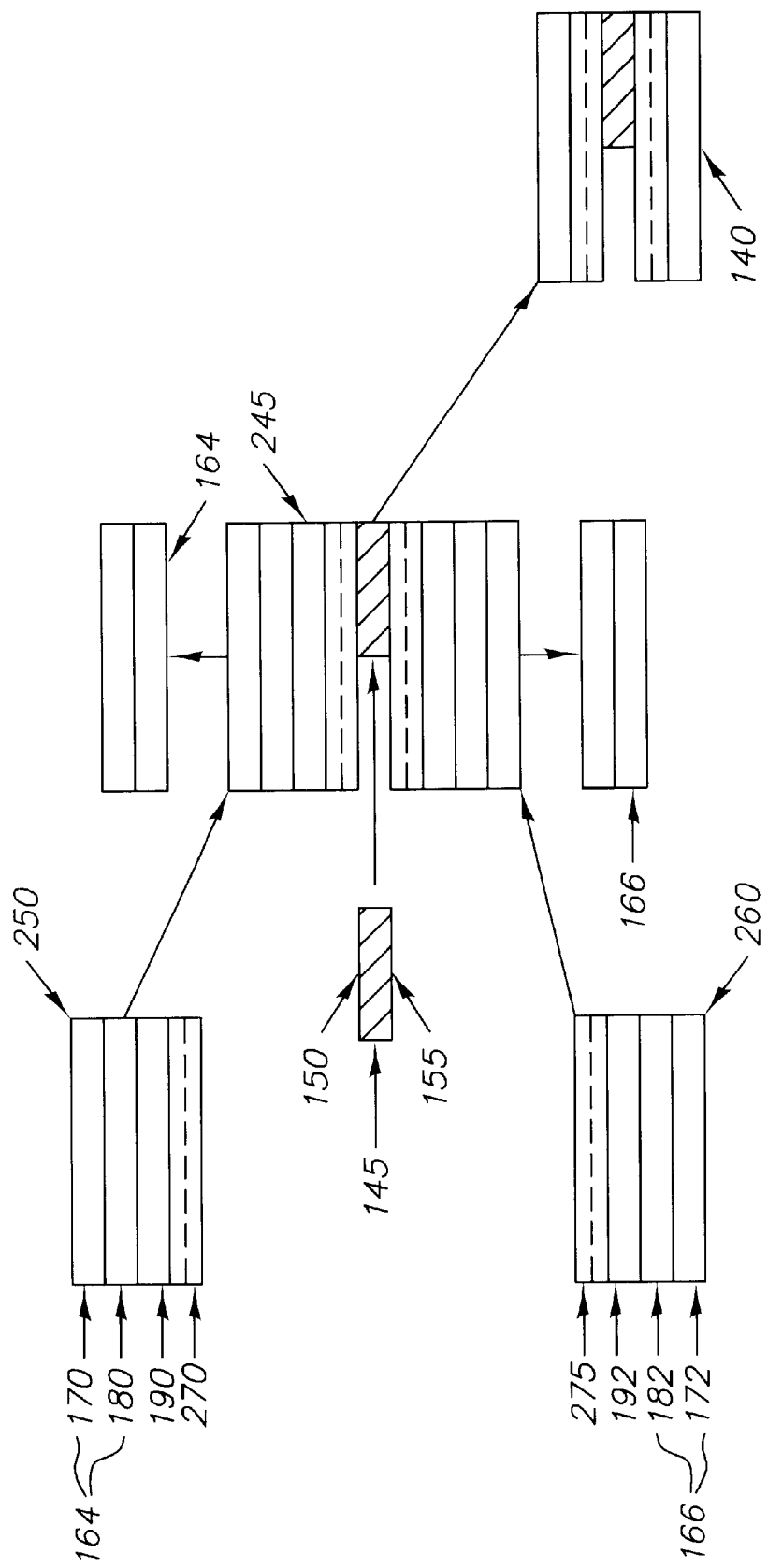
FIG. 4 is a block diagram showing a second embodiment of the method for producing a pre-press proof of the invention.

FIG. 4 shows another method of this invention relating to a method for laminating a dual sided pre-press proof 140 comprising creating a first imaged clear receiver sheet 250 with a first intended image 270 having at least one first image registration mark, a first clear thermoplastic layer 194 and first clear support layer 164 having a first clear release layer 184 and a first clear support base 174. Creating a second imaged clear receiver sheet 260 with a second intended image 275 having second image registration marks, a second clear thermoplastic layer 196 and second clear support layer 166 having a second clear release layer 186 and a second clear support base 176.

The first imaged clear receiver sheet 250 and the second imaged clear receiver sheet 260 to a receiver stock 145 are laminated. The first imaged clear receiver sheet 250 and the second imaged clear receiver sheet on opposite sides of the receiver stock 145 overlapping the receiver stock 145 such that the first image registration marks and said second image registration marks are visibly positioned on top of each other and in registration with each other forming a dual sided image lamination sandwich 245.

Next, the first clear support layer 164 and the second clear support layer 166 are removed, forming a dual sided pre-press proof 140 with a first intended image 270 on one side of a receiver stock 145 and a second intended image 275 on the opposite side and in registration with each other.

The images that can be used in this second method include monochrome or multicolor images.

In alternative embodiments of this invention, only one of the first imaged clear receiver sheet 250 or the second imaged clear receiver sheet 260 has to be clear.

This method also contemplates that the image formed on the imaged clear receiver sheet is an inkjet generated image.

The invention has been described in detail with particular reference to certain preferred embodiments thereof, but it will be understood that variations and modifications can be effected within the scope of the invention.

PARTS LIST

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Dual sided pre-press proof
145. Receiver Stock
150. First side of receiver stock
155. Second side of receiver stock
160. First support layer
162. Second support layer
164. First clear support layer
166. Second clear support layer
170. First support base
172. Second support base
174. First clear support base
176. Second clear support base
180. First release layer
182. Second release layer
184. First clear release layer
186. Second clear release layer
190. First thermoplastic layer
192. Second thermoplastic layer
194. First clear thermoplastic layer
196. Second clear thermoplastic layer
200. Pre-press proof
210. First Pre-laminate sheet
215. Second pre-laminate sheet
220. Pre-lamination sandwich
230. Dual sided pre-laminated receiver stock
245. Dual sided image lamination sandwich
250. First imaged clear receiver sheet
260. Second imaged clear receiver sheet
270. First intended image
275. Second intended image

What is claimed is:

1. A method for laminating a dual sided pre-press proof comprising:

laminating a first side of a receiver stock with a first pre-laminate sheet, wherein said first pre-laminate sheet has a first pre-laminate sheet support layer, a first thermoplastic layer, and a first pre-laminate sheet release layer;

laminating a second side of said receiver stock with a second pre-laminate sheet, wherein said second pre-laminate sheet has a second pre-laminate sheet support layer and a second pre-laminate sheet release layer;

removing the first pre-laminate sheet support layer and said second pre-laminate sheet support layer forming a pre-laminated receiver stock;

creating a first imaged clear receiver sheet with a first clear support layer, a first clear release layer, a second thermoplastic layer, and first image registration mark; and a second imaged clear receiver sheet with a second clear support layer, second clear release layer and second image registration mark;

laminating said first and second imaged clear receiver sheets to said pre-laminated receiver stock, with the first and second imaged clear receiver sheets on opposite sides of the pre-laminated receiver stock overlapping said pre-laminated receiver stock such that the registration marks on the first and second imaged clear receiver sheets are visibly positioned on top of each other and are in registration with each other; and removing said first clear support layer and said second clear support layer forming a dual sided pre-press proof, wherein said images are in registration with each other.

2. The method of claim 1 wherein said second clear support layer is comprises of a support base and release layer.

3. A pre-press proof with a resolution of between 1000 dpi and 4000 dpi formed by the method of claim 1.

4. A pre-press proof with a resolution of between 1200 dpi and 3600 dpi formed by the method of claim 1.

5. The method of claim 1 wherein said imaged clear receiver sheet comprises a monochrome image.

6. The method of claim 1 wherein said imaged clear receiver sheet comprises a multi colored image.

7. The method of claim 1 where in the image formed on the imaged clear receiver sheet is an inkjet generated image.

8. The method of claim 1 where in the only one of the first or second imaged receiver sheets is clear.

9. A method for laminating a dual sided pre-press proof comprising:

creating a first and second imaged clear receiver sheet each with a clear support layer, clear release layer, thermoplastic layer, and image registration marks;

laminating said first and second imaged clear receiver sheets to a receiver stock, with said first and second imaged clear receiver sheets on opposite sides of said receiver stock overlapping said receiver stock such that the image registration marks are visibly positioned on top of each other and in registration with each other; and removing said clear support layers from said first and second imaged clear receiver sheets forming a dual sided pre-press proof, wherein said images are in registration with each other.

10. The method of claim 9 wherein said clear support layer is comprised of a support base and release layer.

11. A pre-press proof with a resolution of between 1000 dpi and 4000 dpi formed by the method of claim 9.

12. A pre-press proof with a resolution of between 1200 dpi and 3600 dpi formed by the method of claim 9.

13. The method of claim 9 wherein said first and second imaged clear receiver sheets each comprises a monochrome image.

14. The method of claim 9 wherein said first and second imaged clear receiver sheets each comprises a multi colored image.

15. The method of claim 9 where in the image formed on the imaged clear receiver sheet is an inkjet generated image.

16. The method of claim 9 where in the only one of the first or second imaged receiver sheets is clear.

* * * * *